(12) United States Patent
Kang et al.

(10) Patent No.: US 9,287,723 B2
(45) Date of Patent: Mar. 15, 2016

(54) CELL BALANCING APPARATUS AND METHOD USING A VOLTAGE VARIATION PATTERN OF EACH CELL TO ESTIMATE AN OPEN CIRCUIT VOLTAGE VALUE FOR EACH CELL

(75) Inventors: Jung-Soo Kang, Daejeon (KR); Do-Youn Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 739 days.

(21) Appl. No.: 12/634,310

(22) Filed: Dec. 9, 2009

(65) Prior Publication Data

US 2010/0085009 A1    Apr. 8, 2010

Related U.S. Application Data

(63) Continuation-in-part of application No. PCT/KR2009/003528, filed on Jun. 30, 2009.

(30) Foreign Application Priority Data

Aug. 8, 2008 (KR) .................. 10-2008-0078189

(51) Int. Cl.
*H02J 7/00* (2006.01)
*H01M 10/48* (2006.01)
*G01R 31/36* (2006.01)

(52) U.S. Cl.
CPC ........... *H02J 7/0019* (2013.01); *H01M 10/482* (2013.01); *H02J 7/0016* (2013.01); *G01R 31/362* (2013.01); *G01R 31/3658* (2013.01); *Y02T 10/7055* (2013.01)

(58) Field of Classification Search
CPC ... H01M 10/482; H02J 7/0019; H02J 7/0016; G01R 31/362; G01R 31/3658; Y02T 10/7055; Y02E 60/12

USPC .......................................................... 320/118
See application file for complete search history.

(56) References Cited

U.S. PATENT DOCUMENTS

| | | | |
|---|---|---|---|
| 6,608,482 B2 * | 8/2003 | Sakai et al. .................... 324/426 |
| 6,661,231 B1 * | 12/2003 | Arai et al. ....................... 324/426 |
| 6,828,757 B2 * | 12/2004 | Furukawa ....................... 320/116 |
| 7,218,118 B1 | 5/2007 | Gonring |
| 7,576,545 B2 * | 8/2009 | Singh et al. .................... 324/427 |

(Continued)

FOREIGN PATENT DOCUMENTS

| | | |
|---|---|---|
| CN | 101116003 A | 1/2008 |
| KR | 10-2002-0064779 A | 7/2002 |
| KR | 10-0680901 B1 | 2/2007 |

*Primary Examiner* — Yalkew Fantu
*Assistant Examiner* — Manuel Hernandez
(74) *Attorney, Agent, or Firm* — Birch, Stewart, Kolasch & Birch, LLP

(57) ABSTRACT

Disclosed is a cell balancing apparatus and method using a voltage variation pattern of a battery cell, which measures voltage of each cell, estimates OCV or SOC of each cell using a voltage variation pattern of each cell including a present voltage and a past voltage, and eliminates a deviation in OCV or SOC between the cells through comparison of the estimated OCV or SOC of each cell. In estimating the OCV of each cell, an output voltage error due to IR drop is corrected. Thus, SOC of each cell may be accurately estimated. And, an accurate estimation of SOC may render substantial elimination for a SOC deviation of each cell. Furthermore, SOC estimating using an output voltage leads to an active cell balancing even during charge and discharge of battery, thereby minimizing an SOC deviation of each cell.

19 Claims, 6 Drawing Sheets

(56) References Cited

U.S. PATENT DOCUMENTS

| | | | |
|---|---|---|---|
| 8,639,460 B2 * | 1/2014 | Kang | G01R 31/36 702/63 |
| 2002/0153864 A1 | 10/2002 | Bertness | |
| 2004/0100227 A1 * | 5/2004 | Yumoto et al. | 320/151 |
| 2004/0135545 A1 * | 7/2004 | Fowler et al. | 320/118 |
| 2004/0178798 A1 * | 9/2004 | Kikuchi et al. | 324/426 |
| 2006/0091863 A1 * | 5/2006 | Melichar | 320/132 |
| 2006/0176022 A1 * | 8/2006 | Namba | 320/130 |
| 2006/0261782 A1 * | 11/2006 | Kim | H01M 10/44 320/132 |
| 2007/0029973 A1 * | 2/2007 | Ashizawa et al. | 320/132 |
| 2008/0065336 A1 * | 3/2008 | Seo | G01R 19/16542 702/63 |
| 2008/0156551 A1 * | 7/2008 | Kawahara | B60L 11/1803 701/22 |
| 2008/0204031 A1 * | 8/2008 | Iwane | G01R 31/3624 324/430 |

* cited by examiner

FIG. 8

| Case | Tempurature | Measured Rest OCV | Estimated OCV | Voltage error | Measured SOC | Estimated SOC | SOC error | Rest Term(SEC) |
|---|---|---|---|---|---|---|---|---|
| 1 | 31 | 178.1 | 177.0113166 | 1.09 | 47.691 | 46 | 1.691 | 250 |
| 2 | 31 | 174.6 | 174.3355 | 0.26 | 42.387 | 42 | 0.387 | |
| 3 | 31.5 | 170.3 | 170.8037797 | -0.50 | 36.31 | 37 | -0.69 | |
| 4 | 31.5 | 169.6 | 170.0762963 | -0.48 | 35.99 | 36 | -0.01 | |
| 5 | 31 | 172.8 | 174.3354881 | -1.54 | 39.789 | 42 | -2.211 | |
| 6 | 31 | 175.2 | 176.0238864 | -0.82 | 43.272 | 44.5 | -1.228 | |
| 7 | 31 | 175.2 | 175.6903928 | -0.49 | 43.272 | 44 | -0.728 | |
| 8 | 31 | 179.1 | 180.7487063 | -1.65 | 49.283 | 52 | -2.717 | |
| 9 | 30.5 | 181 | 182.2019514 | -1.20 | 52.416 | 54.5 | -2.084 | |
| 10 | 30.5 | 180.3 | 180.156521 | 0.14 | 51.239 | 51 | 0.239 | |
| 11 | 32 | 173.3 | 171.9703732 | 1.43 | 40.529 | 38.5 | 2.029 | |
| 12 | 32 | 171.3 | 172.2256885 | -0.93 | 37.703 | 39 | -1.297 | |
| 13 | 32 | 176.6 | 176.0049002 | 0.60 | 45.401 | 44.5 | 0.901 | |
| 14 | 33 | 172.9 | 172.8966874 | 0.00 | 40.005 | 40 | 0.005 | |
| 15 | 33 | 168.1 | 188.5547109 | -0.45 | 33.393 | 34 | -0.607 | |
| 16 | 33 | 167.4 | 168.1807367 | -0.78 | 32.465 | 33.5 | -1.035 | |
| 17 | 33 | 171 | 172.1917868 | -1.19 | 37.334 | 39 | -1.666 | |
| 18 | 33 | 173.5 | 174.2831635 | -0.78 | 40.865 | 42 | -1.135 | |
| 19 | 32.5 | 173.5 | 174.3022193 | -0.80 | 40.838 | 42 | -1.162 | |
| 20 | 32 | 177.7 | 179.2142247 | -1.51 | 47.096 | 49.5 | -2.404 | |
| 21 | 32 | 179.8 | 180.7272646 | -0.93 | 50.456 | 52 | -1.544 | |
| 22 | 32 | 178.9 | 178.9039659 | 0.00 | 48.994 | 49 | -0.006 | |
| 23 | 33 | 171.6 | 170.3965187 | 1.20 | 38.169 | 36.5 | 1.669 | |
| 24 | 34 | 169.6 | 170.3448825 | -0.74 | 35.482 | 36.5 | -1.018 | |
| 25 | 34 | 169.8 | 169.9801317 | -0.18 | 35.754 | 36 | -0.246 | |
| 26 | 25 | 174.5 | 173.8391969 | 0.66 | 42.457 | 41.5 | 0.957 | 500 |
| 27 | 25 | 168.9 | 168.8504879 | 0.05 | 34.642 | 34.5 | 0.142 | |
| 28 | 26 | 176.2 | 177.2510825 | -1.05 | 44.903 | 46.5 | -1.597 | |
| 29 | 26 | 180.6 | 182.4235332 | -1.82 | 51.858 | 55 | -3.142 | |
| 30 | 26 | 182.2 | 181.8552234 | 0.34 | 54.605 | 54 | 0.605 | |
| 31 | 27.5 | 173.8 | 174.2923567 | -0.492356652 | 41.288 | 42 | -0.712 | |
| 32 | 27.5 | 172.8 | 172.1936743 | 0.606325663 | 39.857 | 39 | 0.857 | |
| 33 | 28 | 166.7 | 166.6716504 | 0.028349635 | 31.537 | 31.5 | 0.037 | |
| 34 | 27.5 | 174.5 | 175.6517852 | -1.151785151 | 42.303 | 44 | -1.697 | |
| 35 | 27.5 | 179.1 | 180.729092 | -1.629092047 | 49.325 | 52 | -2.675 | |
| 36 | 26.5 | 180.8 | 180.7014576 | 0.098542421 | 52.166 | 52 | 0.166 | |
| 37 | 28.5 | 172.1 | 172.5775426 | -0.477542635 | 38.827 | 39.5 | -0.673 | |
| 38 | 28 | 172.3 | 172.564243 | -0.264242967 | 39.127 | 39.5 | -0.373 | |
| | | | | | | RMSE | 1.40776601 | |
| | | | | | | MAE | 1.14437838 | |

CELL BALANCING APPARATUS AND METHOD USING A VOLTAGE VARIATION PATTERN OF EACH CELL TO ESTIMATE AN OPEN CIRCUIT VOLTAGE VALUE FOR EACH CELL

This application is a Continuation-In-Part of National Phase Application PCT/KR2009/003528 filed on Jun. 30, 2009, which claims priority under 35 U.S.C. 119(a) to Patent Application No. 10-2008-0078189 filed in Republic of Korea on Aug. 8, 2008, all of which are hereby expressly incorporated by reference into the present application.

BACKGROUND OF THE INVENTION

1. Field of the Invention

The present invention relates to an apparatus and a method for balancing SOC (State Of Charge) of a plurality of cells in a battery, and in particular, to an apparatus and a method for balancing SOC of cells in a battery using a voltage variation pattern of each cell.

2. Description of the Related Art

Generally, a battery used in a high output product such as an electric vehicle should supply a high voltage to a load, and thus contains a plurality of cells connected in series or parallel.

When the battery containing a plurality of cells gets discharged, SOC of each cell becomes different as the usage time of the battery is increased due to the difference in self-discharge rate between the cells. If the battery continues to get discharged in spite of the unbalanced SOC, a specific cell having a lower SOC is over-discharged, resulting in unstable operation of the battery. To solve the unbalanced SOC problem, conventionally a boost or buck circuit is installed at each cell. The boost or buck circuit charges a cell having a relatively lower SOC or discharges a cell having a relatively higher SOC to balance SOC of the cells.

To balance SOC of cells, it is necessary to accurately measure SOC of each cell. However, it is impossible to directly measure SOC of a cell due to the non-linearity characteristics of battery behavior. For this reason, SOC of a cell is indirectly estimated using electrical parameters that can be measured, such as OCV (Open Circuit Voltage), a discharge current and so on.

A method for estimating SOC of a cell using OCV determines OCV of a cell using an output voltage of the cell, and maps the OCV to a corresponding SOC using a lookup table including SOC data based on OCV.

However, a measured output voltage of a cell is different from an actual output voltage of the cell due to IR drop that may occur when a battery is charged or discharged. As a result, the method for estimating SOC of a cell by considering an output voltage of the cell as OCV has a disadvantage of low accuracy.

For reference, IR drop means a phenomenon that voltage changes rapidly when a battery starts to get charged or starts to get discharged while connected to a load. That is, a cell voltage drops rapidly when discharge starts, and a cell voltage rises rapidly when charge starts.

A method for estimating SOC of a cell by integrating the charge/discharge current estimates SOC of a cell using an integrated amount of charge/discharge current of the cell. This method has an advantage of simple estimating. However, current measurement errors are continuously accumulated over time, resulting in low accuracy.

Recently, various methods for estimating SOC of a cell using mathematical models have been suggested. According to the method, SOC of a cell is estimated using various electrical parameters that can be measured, such as voltage, current, temperature and so on. However, because the mathematical model is complex, it takes a long time to estimate SOC of a cell, and it requires a high-grade computing hardware for a complex calculation.

SUMMARY OF THE INVENTION

It is an object of the present invention to solve the problems, and therefore, the present invention provides a cell balancing apparatus and method that accurately estimates OCV and SOC of each cell using an output voltage of each cell, thereby eliminating the need for concern about accumulation of measurement errors.

To achieve the object of the present invention, according to an aspect of the present invention, a cell balancing apparatus using a voltage variation pattern of a battery cell comprises an OCV estimating means for measuring voltage of each cell in a battery and estimating OCV of each cell using a voltage variation pattern of each cell including a present voltage and a past voltage; and a cell balancing means for balancing SOC of the cells by comparing the estimated OCV of each cell.

To achieve the object of the present invention, according to another aspect of the present invention, a cell balancing apparatus using a voltage variation pattern of a battery cell comprises an OCV estimating means for measuring voltage of each cell in a battery and estimating OCV of each cell using a voltage variation pattern of each cell including a present voltage and a past voltage; an SOC estimating means for estimating SOC of each cell from the OCV of each cell; and a cell balancing means for balancing SOC of the cells by comparing the estimated SOC of each cell.

Preferably, the OCV estimating means comprises a voltage measuring unit for measuring voltage of each cell; a temperature measuring unit for measuring temperature of each cell; a data storing unit for periodically receiving the voltage and temperature of each cell from the voltage measuring unit and the temperature measuring unit, and storing the voltage and temperature in a memory unit; an OCV variation estimating unit for estimating a present OCV variation of each cell by calculating an OCV variation of each cell from the voltage variation pattern including a present voltage and a past voltage, stored in the memory unit, using a mathematical model that defines a correlation between the voltage variation pattern and the OCV variation, and reflecting a correction factor corresponding to the temperature of each cell on the calculated OCV variation of each cell; and an OCV estimating unit for estimating a present OCV of each cell by reflecting the calculated OCV variation of each cell on a previous OCV of each cell.

In the present invention, the SOC estimating means may estimate SOC of each cell by mapping OCV and temperature of each cell to a corresponding SOC of each cell using a lookup table including SOC data for each OCV and each temperature.

Optionally, the OCV estimating means corrects the OCV by adding a difference between a weighted mean (a higher weighted value is assigned to an earlier measured voltage) of a present voltage and a past voltage, and a previously estimated OCV to a currently estimated OCV. At this time, the past voltage may be a previous voltage.

According to the present invention, assuming that a present voltage is $V_n$, an $n-1^{th}$ voltage is $V_{n-1}$ and an $n-2^{th}$ voltage is $V_{n-2}$, the present voltage and the past voltage comprise $V_n$, $V_{n-1}$ and $V_{n-2}$.

In the present invention, the estimated OCV variation may be calculated by multiplying the calculated OCV variation by the correction factor.

According to the present invention, the mathematical model may be defined by mathematical calculation of a pattern function that is defined by each cell voltage constituting a voltage variation pattern, and voltage variation between a present voltage and a previous voltage.

And, the correction factor may be calculated by substituting temperature of the battery or each cell into a mathematical model with a temperature as an input parameter and a correction factor of an OCV variation as an output parameter.

In the present invention, the cell balancing means balances SOC of each cell by selecting a target cell for balancing and controlling a balancing circuit corresponding to the selected cell.

According to an aspect of the present invention, the balancing circuit is a discharge circuit, and the cell balancing means selects, as a target cell for balancing, a cell having a higher OCV or SOC than a reference level, and operates a discharge circuit corresponding to the selected cell to decrease the SOC of the cell.

According to another aspect of the present invention, the balancing circuit is a charge circuit, and the cell balancing means selects, as a target cell for balancing, a cell having a lower OCV or SOC than a reference level, and operates a charge circuit corresponding to the selected cell to increase the SOC of the cell.

According to yet another aspect of the present invention, the balancing circuit comprises a charge circuit and a discharge circuit, and the cell balancing means selects, as a target cell for balancing, a cell having an OCV or SOC out of a reference range, switches a balancing circuit corresponding to a selected cell having a higher OCV or SOC than a maximum limit of the reference range to a discharge circuit to decrease the SOC of the selected cell, and switches a balancing circuit corresponding to a selected cell having a lower OCV or SOC than a minimum limit of the reference range to a charge circuit to increase the SOC of the selected cell.

To achieve another object of the present invention, according to an aspect of the present invention, a cell balancing method for balancing SOC of a plurality of cells in a battery using a voltage variation pattern of each cell comprises the steps of measuring voltage of each cell and estimating an OCV of each cell using a voltage variation pattern of each cell including a present voltage and a past voltage; and balancing SOC of the cells through comparison of the estimated OCV of each cell.

To achieve another object of the present invention, according to another aspect of the present invention, a cell balancing method for balancing SOC of a plurality of cells in a battery using a voltage variation pattern of each cell comprises the steps of measuring voltage of each cell and estimating OCV of each cell using a voltage variation pattern of each cell including a present voltage and a past voltage; estimating SOC of each cell from the OCV of each cell; and balancing SOC of the cells through comparison of the estimated SOC of each cell.

The object of the present invention may be achieved by a hardware module such as a microprocessor that performs necessary steps to balance SOC of each cell in a battery by estimating and comparing OCV or SOC of each cell in the battery.

To achieve the object of the present invention, a hardware module according to an aspect of the present invention executes the processes of measuring voltage of each cell in a battery and estimating OCV of each cell using a voltage variation pattern of each cell including a present voltage and a past voltage; and balancing SOC of each cell through comparison of the estimated OCV of each cell.

To achieve the object of the present invention, a hardware module according to another aspect of the present invention executes the processes of measuring voltage of each cell in a battery and estimating OCV of each cell using a voltage variation pattern of each cell including a present voltage and a past voltage; estimating SOC of each cell from the OCV of each cell; and balancing SOC of each cell through comparison of the estimated SOC of each cell.

BRIEF DESCRIPTION OF THE DRAWINGS

Other objects and aspects of the present invention will become apparent from the following description of embodiments with reference to the accompanying drawings.

FIG. 8 is a table illustrating comparison and analysis result for battery temperature, measured OCV, estimated OCV, difference (error value) between the measured OCV and the estimated OCV, measured SOC, estimated SOC, and difference (error value) between the measured SOC and the estimated SOC, obtained through 38 times experiments under conditions of example 2.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
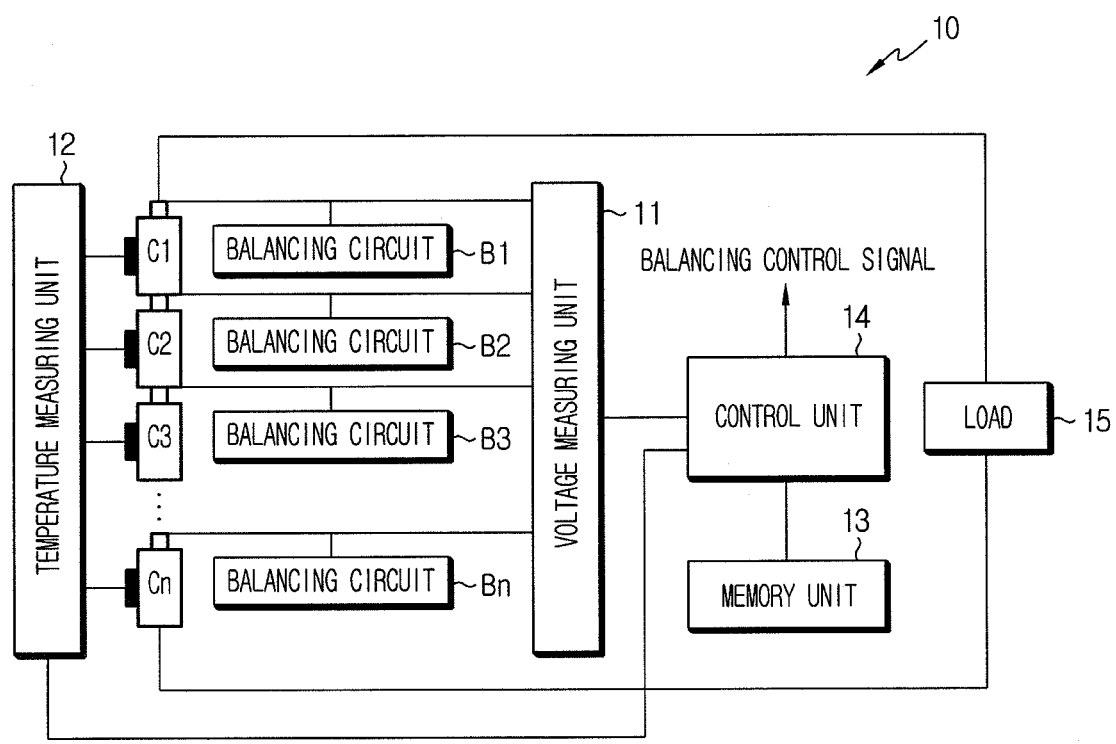
FIG. 1 is a block diagram of a cell balancing apparatus using a voltage variation pattern of each cell according to an embodiment of the present invention.

FIG. 1 is a schematic block diagram of a cell balancing apparatus using a voltage variation pattern of each cell in a battery according to an embodiment of the present invention.

Referring to FIG. 1, the cell balancing apparatus 10 using a voltage variation pattern of each cell in a battery according to the present invention comprises a voltage measuring unit 11, a temperature measuring unit 12, a memory unit 13 and a control unit 14. Although FIG. 1 shows a battery containing n cells (C1 to Cn) connected in series, the n cells (C1 to Cn) may be connected in parallel. The battery is connected to a load 15 and supplies power to the load 15, like a conventional battery.

The voltage measuring unit 11 periodically measures an output voltage of each cell (C1 to Cn) in the battery and outputs the measured output voltage to the control unit 14.

The temperature measuring unit 12 periodically measures temperature of each cell (C1 to Cn) in the battery and outputs the measured temperature to the control unit 14.

The memory unit 13 is a storage medium for storing SOC data for each temperature and each OCV that has been obtained through an experiment, the output voltage and temperature obtained periodically from each cell (C1 to Cn), estimated OCV and SOC of each cell (C1 to Cn), and a cell balancing program that estimates OCV and SOC of each cell (C1 to Cn) and balances the cells.

Here, the SOC data for each temperature and each OCV and the cell balancing program are stored in a non-volatile area of the memory unit 13. Thus, although the memory unit 13 is not supplied with power, said data does not disappear.

The output voltage and temperature of each cell (C1 to Cn) measured by the voltage measuring unit 11 and the temperature measuring unit 12 and the estimated OCV and SOC of each cell (C1 to Cn) are stored in a volatile area of the memory unit 13. Thus, said data is stored and retained only while the memory unit 13 is supplied with power.

The control unit 14 loads the cell balancing program from the memory unit 13 when the apparatus is initiated, periodically receives the output voltage and temperature of each cell (C1 to Cn) from the voltage measuring unit 11 and the temperature measuring unit 12, stores said data in the memory unit 13, estimates OCV and SOC of each cell (C1 to Cn) based on the stored data, and performs cell balancing to reduce a deviation in OCV or SOC between the cells (C1 to Cn).

In the present invention, the cells (C1 to Cn) are not limited to a specific type, and may be, for example, a lithium ion battery, a lithium polymer battery, a nickel cadmium battery, a nickel hydrogen battery or a nickel zinc battery, that is capable of repetitive charging and discharging.

The load 15 is not limited to a specific type, and may be, for example, a portable electronic device such as a video camera, a mobile phone, a portable PC, a PMP (Personal Multimedia Player) or an MP3 player, a motor of an electric vehicle or hybrid vehicle, a DC to DC converter and so on.

Figure 2:
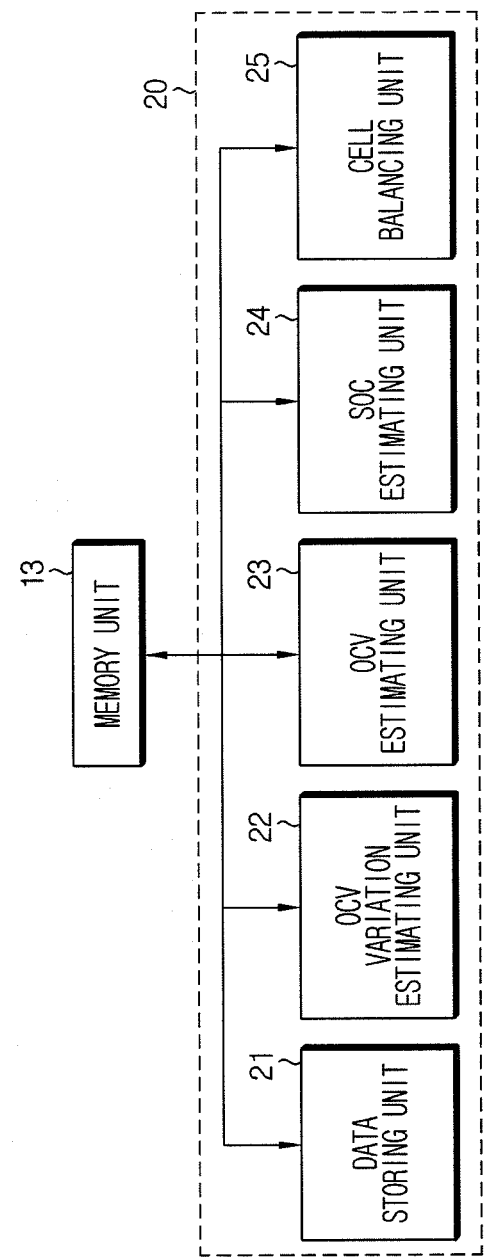
FIG. 2 is a functional block diagram of a cell balancing module according to a preferred embodiment of the present invention.

FIG. 2 is a functional block diagram of a cell balancing module 20 corresponding to the cell balancing program according to a preferred embodiment of the present invention.

Referring to FIG. 2, the cell balancing module 20 comprises a data storing unit 21, an OCV variation estimating unit 22, an OCV estimating unit 23, an SOC estimating unit 24, and a cell balancing unit 25.

The data storing unit 21 periodically receives the output voltage and temperature of each cell (C1 to Cn) from the voltage measuring unit 11 and the temperature measuring unit 12 shown in FIG. 1, and stores said data in the memory unit 13. A cycle of measuring the output voltage and the temperature of each cell (C1 to Cn) corresponds to a cell balancing cycle, however the present invention is not limited in this regard.

When the data storing unit 21 stores the output voltage and temperature of each cell (C1 to Cn) in the memory unit 13 at an $n^{th}$ measurement cycle (n≥3, n is an integer), the OCV variation estimating unit 22 estimates an OCV variation of each cell (C1 to Cn).

Specifically, the OCV variation estimating unit 22 estimates an OCV variation of each cell, i.e., an OCV variation based on a previous OCV using a voltage variation pattern of each cell (C1 to Cn). That is, the OCV variation estimating unit 22 estimates how much a present OCV was changed from the previous OCV.

For example, when the output voltage and temperature of each cell (C1 to Cn) are all stored in the memory unit 13 at an $n^{th}$ measurement cycle, the OCV variation estimating unit 22 reads a present output voltage, a previous output voltage and a present temperature of each cell from the memory unit 13. Then, the OCV variation estimating unit 22 estimates an OCV variation $\Delta OCV_n(k)$ by the following Equation 1.

$$\Delta OCV_n(k) = OCV_n(k) - OCV_{n-1}(k) = G(V) \times F(T) \qquad \text{[Equation 1]}$$

where 'n' is an order index of estimating an OCV variation, and 'k' is an order index of a cell. Accordingly, $\Delta OCV_n(k)$ is an estimated OCV variation of a $k^{th}$ cell at the $n^{th}$ time.

In the above Equation 1, G(V) is a calculating function of an OCV variation that maps an output voltage variation '$V_n - V_{n-1}$' between a present output voltage and a previous output voltage to an OCV variation $\Delta OCV_n(k)$. F(T) is an OCV correction function that corrects the OCV variation $\Delta OCV_n(k)$ depending on temperature of a cell by reflecting the effects of OCV change due to a change in temperature of a cell. Here, $V_n$ and $V_{n-1}$ are output voltages of a cell (Ck), of which an OCV variation is estimated.

The G(V) is a function that does not directly convert an output voltage variation into an OCV variation, but converts an output voltage variation into an OCV variation after correcting an output voltage error (a difference between a measured voltage and an actual voltage) caused by IR drop. That is, when a present output voltage variation tends to become larger than a previous output voltage variation, G(V) decreases the output voltage variation and outputs the decreased output voltage variation as an OCV variation. When a present output voltage variation tends to maintain the level of a previous output voltage variation, G(V) directly outputs the output voltage variation as an OCV variation. When a present output voltage variation tends to become smaller than a previous output voltage variation, G(V) slightly increases the output voltage variation and outputs the increased output voltage variation as an OCV variation.

The G(V) may be obtained through mathematical modeling using numerical analysis of a correlation between an output voltage variation and a corresponding OCV variation under a specific temperature condition.

For example, after a reference cell having the same conditions with a cell in a battery is fully charged under laboratory conditions where an output voltage and OCV of a cell can be measured, the reference cell is discharged with a varying discharge current. During the discharge, an output voltage and OCV under no load conditions of the reference cell are measured at a regular cycle. G(V) may be calculated by mathematically analyzing a functional relationship between an output voltage variation between output voltages $V_n$, $V_{n-1}$ and $V_{n-2}$ and a corresponding OCV variation. Here, the number of output voltages for the output voltage variation can be expanded to at least 4.

The G(V) may be generalized by the following Equation 2.

$$G(V)=[V_n-V_{n-1}]\times g(V_n,V_{n-1},V_{n-2},\ldots)$$ [Equation 2]

where $g(V_n, V_{n-1}, V_{n-2}, \ldots)$ is a pattern function that defines an output voltage variation of a reference cell. The symbol '...' means that the pattern function may be defined by at least three output voltages including a present output voltage. The pattern function 'g' defines a correlation between an OCV variation and an output voltage variation of a plurality of output voltages that have been experimentally obtained. For example, the function 'g' may be represented as a relative ratio of a previous output voltage variation to a present output voltage variation. However, the present invention is not limited to any specific equation of a pattern function.

Meanwhile, an internal resistance of a cell changes depending on temperature. If the internal resistance of a cell is changed, an output voltage variation and an OCV variation of the cell are changed even under the same charge or discharge condition. In consideration of the above, F(T) corrects an OCV variation determined by G(V) depending on temperature condition of a cell. In other words, F(T) is a function for correcting an OCV variation estimated by G(V) in the case that temperature of a cell is different with a temperature referred to calculate the G(V). F(T) may be obtained by analyzing a correlation between an output voltage variation and an OCV variation with a change in temperature at a regular interval. That is, F(T) is obtained through a mathematical modeling using temperature T and a correction factor of an OCV variation as an input parameter and an output parameter, respectively, after quantitatively measuring the degree of change of an OCV variation obtained at each measurement temperature based on an OCV variation corresponding to temperature used in calculating G(V), under experimental conditions that each output voltage variation pattern at each measurement temperature varying at a regular interval, for example 1° C. is equal. Here, the correction factor increases or decreases an estimated OCV variation of each cell depending on temperature T. For a simpler calculation of the correction factor, it is possible to construct and refer to a look-up table including a set of correction factors for each temperature T.

After the OCV variation of each cell (C1 to Cn) is calculated at an $n^{th}$ measurement cycle, the OCV estimating unit 23 reads, from the memory unit 13, an $n-1^{th}$ OCV of each cell that was estimated at the previous cycle. And, the OCV estimating unit 23 estimates an $n^{th}$ OCV by adding, to the $n-1^{th}$ OCV, the OCV variation estimated by the OCV variation estimating unit 22.

Preferably, in estimating OCV of each cell, the OCV estimating unit 23 calculates a weighted mean $V_{n(meanvalue)}$ between a present output voltage $V_n$ and a past output voltage by the following Equation 3.

$$V_{n(meanvalue)}=(A_1*V_1+A_2*V_2+\ldots+A_{n-1}*V_{n-1}+A_n*V_n)/A_{total}$$

$$A_{total}=A_1+A_2+A_3+\ldots+A_n$$ [Equation 3]

where as p increases, $A_p$ ($1\leq p\leq n$) decreases. For example, in the case n=10, $A_p$ may have a value decreasing from 10 by 1. Alternatively, $A_1*V_1+A_2*V_2+\ldots+A_{n-2}*V_{n-2}$ may be omitted from Equation 3. Even in this case, $A_p$ has still the same tendency. It is possible that $A_1*V_1+A_2*V_2+\ldots+A_{n-2}*V_{n-2}$ is regarded as 0 and a relatively large value is assigned to $A_{n-1}$ rather than $A_n$. For example, 90 and 10 may be assigned to $A_{n-1}$ and $A_n$, respectively.

The OCV estimating unit 23 may further correct the estimated $n^{th}$ OCV of each cell (C1 to Cn) by adding a difference between a weighted mean $V_{n(meanvalue)}$ and an $n-1^{th}$ $OCV_{n-1}$ to the estimated $n^{th}$ OCV for each cell (C1 to Cn). If the weighted mean is used to further correct an $n^{th}$ OCV of each cell (C1 to Cn), an error in an estimated $n^{th}$ OCV of each cell (C1 to Cn) may be reduced although an output voltage of the cell changes rapidly.

After the $n^{th}$ OCV of each cell (C1 to Cn) is estimated, the OCV estimating unit 23 stores the estimated $n^{th}$ OCV of each cell (C1 to Cn) in the memory unit 13.

The SOC estimating unit 24 maps the $n^{th}$ OCV of each cell (C1 to Cn) estimated by the OCV estimating unit 23, and temperature of each cell (C1 to Cn) measured when estimating the $n^{th}$ OCV to a corresponding SOC in the SOC data for each temperature and each OCV that is stored in the memory unit 104, and outputs the mapped SOC.

The SOC data for each temperature and each OCV is recorded in the form of a look-up table as shown in the following Table 1.

TABLE 1

| SOC | ... | −30° C. | 0° C. | 30° C. | ... |
|---|---|---|---|---|---|
| 0% | ... | 2.7 V | 2.78 V | 2.77 V | ... |
| 1% | ... | 2.82 V | ... | ... | ... |
| 2% | ... | 2.97 V | ... | ... | ... |
| . | . | . | . | . | . |
| . | . | . | . | . | . |
| . | . | . | . | . | . |

The SOC estimating unit 24 estimates an $n^{th}$ SOC of each cell (C1 to Cn) by mapping the OCV and temperature of each cell (C1 to Cn) to a corresponding SOC using the look-up table where SOC data for each temperature and each OCV is recorded as shown in the Table 1. For example, if OCV of a specific cell is 2.97V and temperature of the cell measured when estimating the $n^{th}$ OCV is −30° C., an $n^{th}$ SOC of the cell is 2%.

After the $n^{th}$ SOC of each cell (C1 to Cn) is estimated, the SOC estimating unit 24 stores the estimated $n^{th}$ SOC of each cell (C1 to Cn) in the memory unit 13.

After the $n^{th}$ OCV or $n^{th}$ SOC of each cell (C1 to Cn) is stored in memory unit 13 at an $n^{th}$ measurement cycle, the cell balancing unit 25 calculates an SOC deviation of each cell (C1 to Cn). The SOC deviation is defined as a difference between SOC of each cell (C1 to Cn) and an average SOC of the total cells (C1 to Cn). However, the present invention is not limited to any specific method for defining an SOC deviation of a cell.

After the SOC deviation of each cell (C1 to Cn) is calculated, the cell balancing unit 25 selects a target cell for balancing. The target cell for balancing may be selected by the following methods.

A first method selects a cell having a larger SOC deviation than a reference level (for example, 10%) as a target cell for balancing.

A second method selects a cell having a smaller SOC deviation than a reference level (for example, −10%) as a target cell for balancing.

A third method selects a cell having an SOC deviation out of a reference range (for example, −10% to 10%) as a target cell for balancing.

After the target cell for balancing is selected, the cell balancing unit 25 applies a balancing control signal to a balancing circuit (Bk) connected to the selected cell to operate the balancing circuit (Bk) for a predetermined period of time, thereby eliminating the SOC deviation of the selected cell.

According to the first method, the balancing circuit (Bk) is preferably a discharge circuit. In this case, the cell balancing unit 25 may perform cell balancing by calculating a discharge time of each target cell for balancing in advance, and operating each balancing circuit (Bk) in a discharge mode for the calculated time. The discharge time of the target cell is calculated in consideration of discharge efficiency of the balancing circuit (Bk) and an amount of discharge of the cell, required to eliminate the SOC deviation of the cell.

According to the second method, the balancing circuit (Bk) is preferably a charge circuit. In this case, the cell balancing unit 25 may perform cell balancing by calculating a charge time of each target cell for balancing in advance, and operating each balancing circuit (Bk) in a charge mode for the calculated time. The charge time of the target cell is calculated in consideration of charge efficiency of the balancing circuit (Bk) and an amount of charge of the cell, required to eliminate the SOC deviation of the cell. In the case that the balancing circuit (Bk) is a charge circuit, the balancing circuit (Bk) may be supplied with a charge current from an external power source (not shown) or from another cell having a higher SOC. The external power source may be a DC to DC converter, however the present invention is not limited in this regard.

According to the third method, the balancing circuit (Bk) comprises a charge circuit and a discharge circuit. In this case, the cell balancing unit 25 may perform cell balancing by calculating a charge or discharge time of each target cell for balancing in advance, and operating each balancing circuit (Bk) in a charge or discharge mode for the calculated time. The cell balancing unit 25 switches, to a discharge circuit, a balancing circuit (Bk) connected to a cell having a higher SOC than a reference level, and operates the balancing circuit (Bk) in a discharge mode. On the contrary, the cell balancing unit 25 switches, to a charge circuit, a balancing circuit (Bk) connected to a cell having a lower SOC than a reference level, and operates the balancing circuit (Bk) in a charge mode. The charge time of the target cell is calculated in consideration of charge efficiency of the charge circuit included in the balancing circuit (Bk) and an amount of charge of the cell, required to eliminate the SOC deviation of the cell. And, the discharge time of the target cell is calculated in consideration of discharge efficiency of the discharge circuit included in the balancing circuit (Bk) and an amount of discharge of the cell, required to eliminate the SOC deviation of the cell. Further, in the case that the balancing circuit (Bk) operates as a charge circuit, the balancing circuit (Bk) may be supplied with a charge current from an external power source or from another cell having a higher SOC, in the same way as the second method.

Although this embodiment shows that the cell balancing unit 25 performs cell balancing based on an SOC deviation of each cell (C1 to Cn), the cell balancing unit 25 may perform cell balancing based on an OCV deviation of each cell (C1 to Cn). In this case, the cell balancing unit 25 reads an $n^{th}$ OCV of each cell (C1 to Cn) from the memory unit 13, calculates an OCV deviation of each cell (C1 to Cn), selects a cell of which an OCV deviation meets the balancing standard as a target cell for balancing, calculates a charge or discharge time required to perform cell balancing on the selected cell, and operates a balancing circuit (Bk) connected to the selected cell in a charge or discharge mode for the calculated time to eliminate the OCV deviation of the target cell.

Here, the target cell for balancing is selected in a similar way to the first to third methods for selecting a target cell in the above-mentioned embodiment. In other words, a cell having a larger OCV deviation than a reference level (for example, 0.5V), a cell having a smaller OCV deviation than a reference level (for example, −0.5V) or a cell having an OCV deviation out of a reference range (for example, −0.5V to 0.5V) is selected as a target cell for balancing.

The charge time of the target cell for balancing is calculated in consideration of charge efficiency of the balancing circuit (Bk) and an amount of charge of the target cell, required to eliminate the OCV deviation of the target cell. And, the discharge time of the target cell for balancing is calculated in consideration of discharge efficiency of the balancing circuit (Bk) and an amount of discharge of the target cell, required to eliminate the OCV deviation of the target cell.

In the case that the cell balancing unit 25 performs cell balancing based on an OCV deviation of each cell (C1 to Cn), the balancing circuit (Bk) operates substantially in the same way as the above-mentioned embodiment. Therefore, the repeated description is omitted.

In the present invention, it is obvious to an ordinary person skilled in the art that OCV and SOC may be repeatedly estimated at a regular cycle based on output voltage and temperature of each cell (C1 to Cn) and that cell balancing may be repeatedly performed at a regular cycle based on an SOC deviation or an OCV deviation of each cell (C1 to Cn).

Although this embodiment shows that the cell balancing module 20 is configured as a program, the cell balancing module 20 may be configured as a hardware module using a customized semiconductor technology such as ASIC. In this case, it is obvious to an ordinary person skilled in the art that the control unit 14 will comprises a logic circuit module incorporating a function of the cell balancing module 20.

According to an aspect of the present invention, the hardware module executes a process of measuring voltage of each cell in a battery and estimating OCV of each cell using a voltage variation pattern of each cell including a present voltage and a past voltage. And, the hardware module executes a process of balancing SOC of each cell through comparison of the estimated OCV of each cell.

According to another aspect of the present invention, the hardware module may execute a process of estimating OCV of each cell, and then execute a process of estimating SOC of each cell from the estimated OCV and temperature of each cell. And, the hardware module may execute a process of balancing SOC of each cell through comparison of the estimated SOC of each cell.

According to the present invention, the hardware module may apply a correction factor depending on temperature at the time of estimating an OCV variation of each cell. And, the hardware module may correct the OCV estimated using a weighted mean which is calculated from a present voltage and a past voltage. And, the hardware module may perform a cell balancing operation using the first to third methods. It is obvious that application of a correction factor, OCV correction by a weighted mean, and cell balancing according to this embodiment may be implemented in the same way as the above-mentioned embodiment. And, it is obvious that the hardware module performs not only the above-mentioned functions but also various functions of the cell balancing module 20 in substantially the same as the cell balancing module 20.

Figure 3:
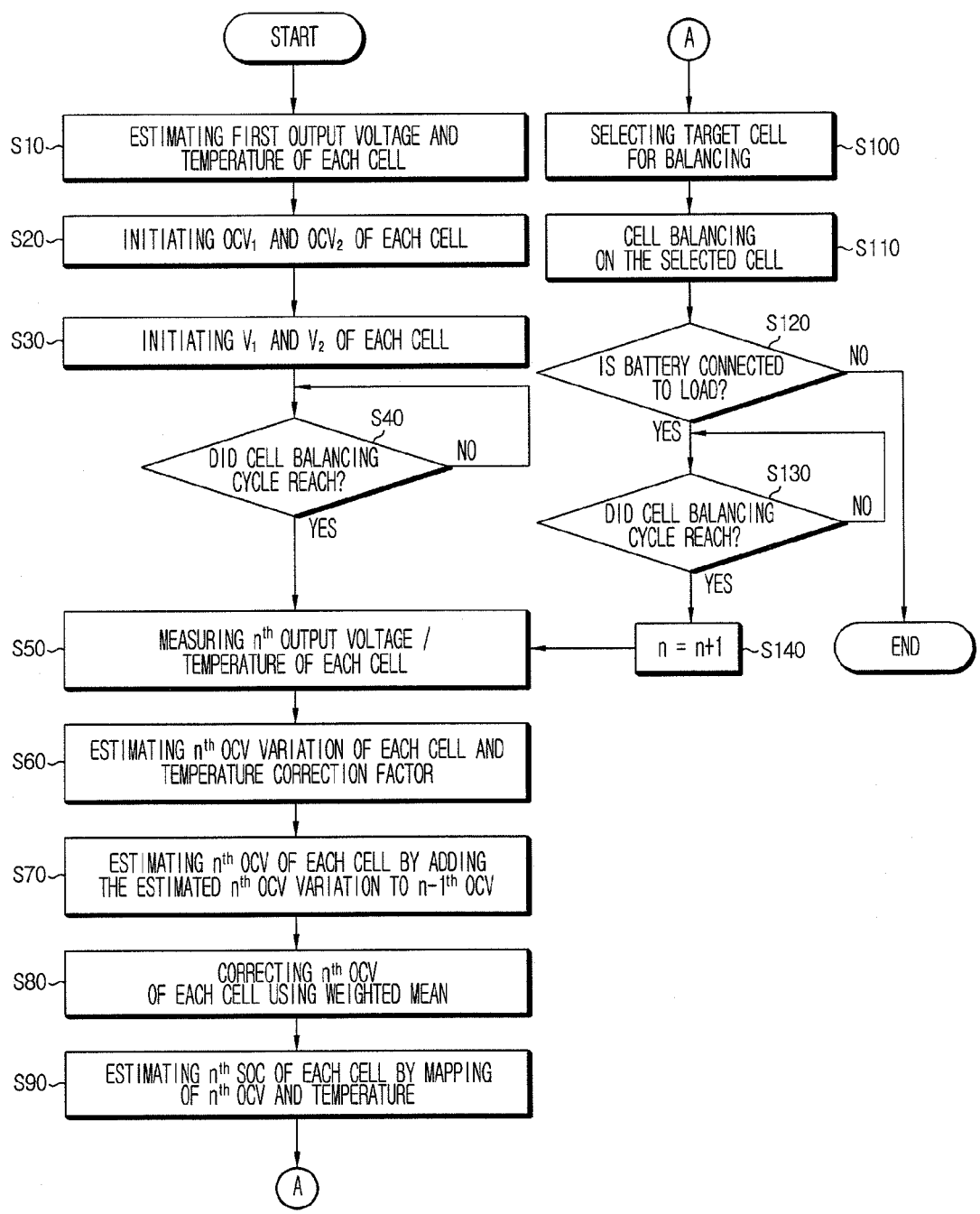
FIG. 3 is a flowchart of a cell balancing method using a voltage variation pattern of each cell according to an embodiment of the present invention.

FIG. 3 is a flowchart of a cell balancing method using a voltage variation pattern of each cell in a battery according to an embodiment of the present invention.

Hereinafter, note that each step is performed by the control unit 14 of the cell balancing apparatus of FIG. 1.

In the step S10, immediately before a battery is connected to a load, a first output voltage and temperature of each cell are measured. Here, the first output voltage is an output voltage under no load conditions, and thus corresponds to a first OCV.

In the step S20, the first output voltage measured at the step S10 is assigned to a first open circuit voltage ($OCV_1$) and a second open circuit voltage ($OCV_2$) of each cell. The first open circuit voltage ($OCV_1$) and the second open circuit voltage ($OCV_2$) of each cell are initiated.

Likewise, in the step S30, the first output voltage is assigned to a first output voltage ($V_1$) and a second output voltage ($V_2$) for each cell. The first output voltage ($V_1$) and the second output voltage ($V_2$) of each of cell are initiated.

In the step S40, it is determined whether or not a cell balancing cycle of the battery reached. Here, the cell balancing cycle may be set arbitrarily.

In the step S50, when a cell balancing cycle reached, an $n^{th}$ output voltage and temperature of each cell are measured by the voltage measuring unit 11 and the temperature measuring unit 12, respectively, and stored in the memory unit 13. For reference, 'n' is 3 in the step S50.

In the step S60, an $n^{th}$ OCV variation of each cell is estimated using a voltage variation pattern and temperature of each cell. An equation for estimating the $n^{th}$ OCV variation is described above. Because 'n' is now 3, the voltage variation pattern of each cell represents a voltage variation between third, second and first output voltages. However, if 'n' is equal to or larger than 4, the voltage variation pattern of each cell may represent a voltage variation between at least 4 output voltages.

In the step S70, an $n^{th}$ OCV of each cell is estimated by adding an $n^{th}$ OCV variation to an $n-1^{th}$ OCV for each cell. Here, because 'n' is now 3, a 3rd OCV of each cell is estimated by adding a 3rd OCV variation to a 2nd OCV for each cell.

In the step S80, optionally the $n^{th}$ OCV is further corrected by calculating a weighted mean between an $n^{th}$ output voltage and output voltage(s) measured before $n^{th}$ order and adding a difference between the calculated weighted mean and the $n-1^{th}$ OCV to the $n^{th}$ OCV. An equation for calculating the weighted mean is described above.

In the step S90, an $n^{th}$ SOC of each cell is estimated by mapping the estimated $n^{th}$ OCV and the measured temperature of each cell to a corresponding SOC using a look-up table where SOC data is recorded for each temperature and each OCV.

In the step S100, a target cell for balancing is selected by calculating an SOC deviation or OCV deviation of each cell. At this time, if a target cell for balancing does not exist, the subsequent steps are terminated. A method for calculating the SOC deviation or OCV deviation of each cell is described above.

In the step S110, the SOC deviation or OCV deviation is eliminated by controlling a balancing circuit connected to a cell selected as the target cell for balancing to charge or discharge the corresponding cell. Methods for performing cell balancing on the selected cell and methods for controlling the balancing circuit depending on the cell balancing methods are described above.

In the step S120, it is judged whether or not the battery is still connected to the load.

In the step S130, in the case that the battery is judged to be connected to the load, it is determined whether or not a cell balancing cycle of the battery reached.

In the step S140, in the case that a cell balancing cycle of the battery reached, the process returns to the step S50 with 'n' increased by 1. Then, an $n+1^{th}$ OCV variation of each cell is estimated, an $n+1^{th}$ OCV of each cell is estimated by adding the estimated $n+1^{th}$ OCV variation to an $n^{th}$ OCV for each cell, the $n+1^{th}$ OCV of each cell is corrected using a difference between a weighted mean and the $n^{th}$ OCV, an $n+1^{th}$ SOC of each cell is estimated using a look-up table, and a cell balancing is performed using an $n+1^{th}$ SOC deviation or $n+1^{th}$ OCV deviation of each cell. This process is repeated.

In the above-mentioned embodiment, it should be understood that SOC is interpreted as an equivalent concept to state of discharge. The SOC and state of discharge are just expressed in different point of view, and have the same meaning of remaining available energy of a cell. For example, 20% of SOC means that 20% of available electrical energy in a cell when fully charged is remained. In a different point of view, this means that 80% of available electrical energy in a cell when fully charged was consumed by discharge. That is, 20% of SOC is conceptually equivalent to 80% of state of discharge. In this context, it should be understood that estimation of SOC of a cell is interpreted as an equivalent concept to estimation of state of discharge. Accordingly, it is obvious to those skilled in the art that estimation of SOC of each cell by the cell balancing apparatus of the present invention may mean quantitative determination of how much the full-charged electrical energy of a cell was discharged.

EXPERIMENTAL EXAMPLE

Hereinafter, it is specified through the following experimental example that an estimated SOC of a cell according to the present invention approximately approaches an actual SOC of the cell. However, the following experimental example is just for illustrating the present invention, not intended to limit the scope of the invention. Hereinafter, note that estimation and measurement of SOC and OCV is performed on the total cells in a battery.

Experimental Example 1

In the experimental example 1, vehicle driving simulations were conducted consecutively under UDDS (Urban Dynamometer Driving Schedule), HWFET (Highway Fuel Economy Test), NYCC (New York City Cycle) and US06 (Aggressive Driving Cycle), mandated by EPA (Environmental Protection Agency), which are used as vehicle testing standards in the electric or hybrid vehicle industry, so as to charge and discharge a battery of the vehicle. Here, the UDDS and NYCC are test cycles that simulate heavy city driving conditions for vehicles. The HWFET is a test cycle that simulates highway driving conditions for vehicles. And, the US06 is a test cycle that simulates high speed driving conditions for vehicles.

Figure 4:
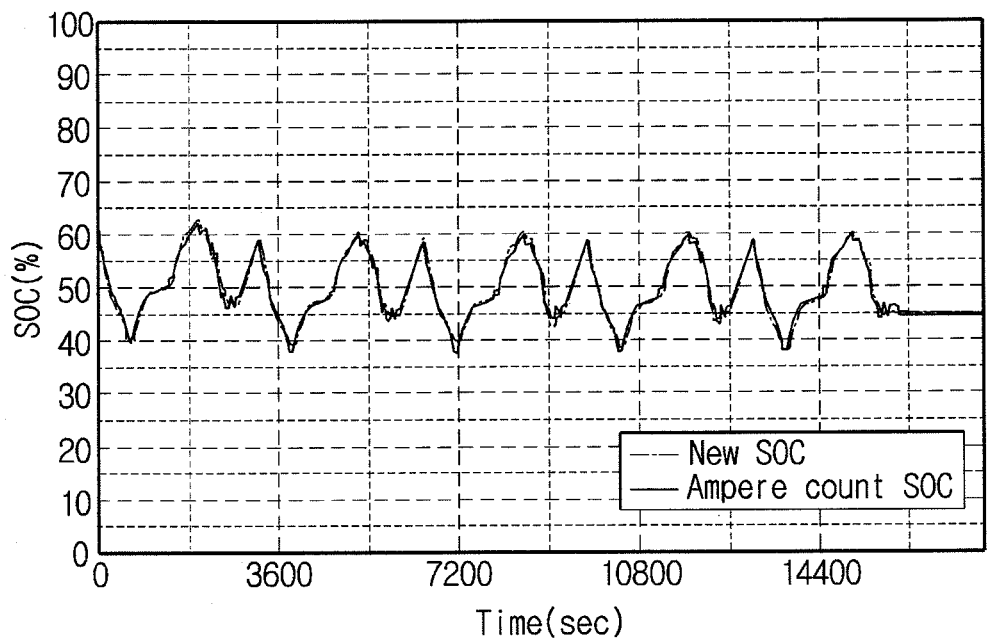
FIG. 4 is a graph illustrating a comparison between an estimated SOC by the present invention and an estimated SOC by a conventional current integration method in the case that a charge/discharge cycle of example 1 is applied.

FIG. 4 is a graph illustrating a comparison between an estimated SOC by the present invention and an estimated SOC by a conventional current integration method, in the case that a charge/discharge cycle of example 1 is applied.

Referring to FIG. 4, the estimated SOC by the conventional current integration method shows an unstable SOC profile due to accumulation of current measurement errors. However, the estimated SOC by the present invention shows more stable SOC profile than that of the conventional current integration method. Accordingly, it is found that the present invention can estimate SOC of a cell more stably than the conventional current integration method.

Figure 5:
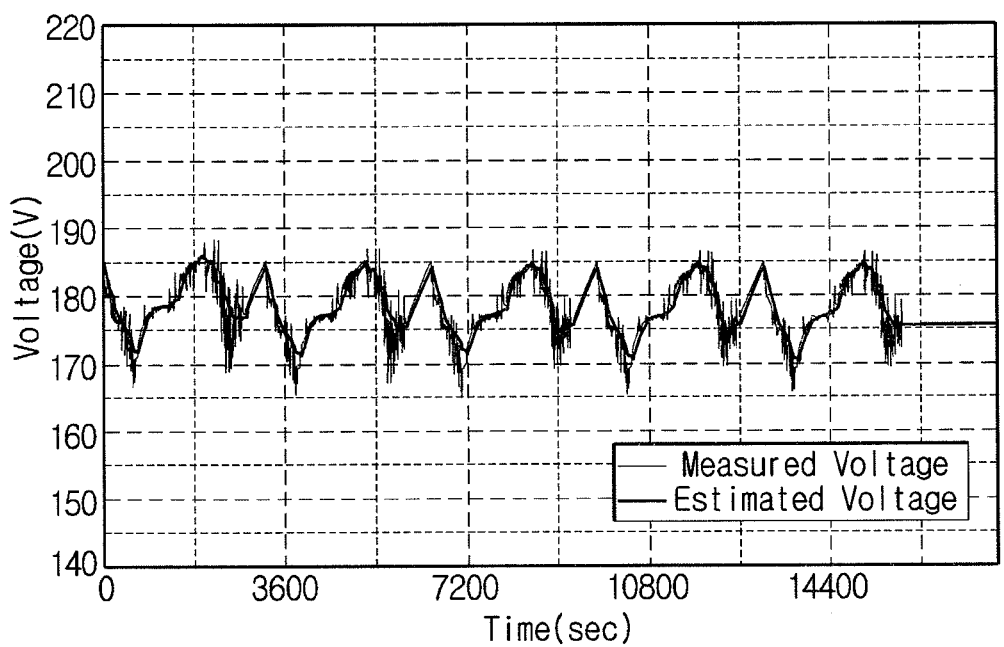
FIG. 5 is a graph illustrating a comparison between an estimated OCV by the present invention and a measured output voltage in the case that a charge/discharge cycle of conditions suggested in example 1 is applied.

FIG. 5 is a graph illustrating a comparison between an estimated OCV by the present invention and an actual cell output voltage in the case that a charge/discharge cycle of conditions suggested in example 1 is applied.

Referring to FIG. 5, the actual output voltage generates a drastic voltage variation pattern due to IR drop, while the estimated OCV by the present invention does not generate a drastic voltage variation pattern. That is, the present invention allows a stable OCV profile that is not affected by IR drop, thereby reducing an error in estimating SOC of a cell.

Experimental Example 2

In the experimental example 2, first and second charge/discharge cycles are repeated under the same vehicle driving simulations as the experimental example 1. The first charge/discharge cycle is 250 seconds, and the second charge/discharge cycle is 50 seconds. A rest period is given for 10 minutes between charge/discharge cycles, so as to stabilize an output voltage of a cell. After the rest period ends, the charge/discharge cycle restarts.

Figure 6:
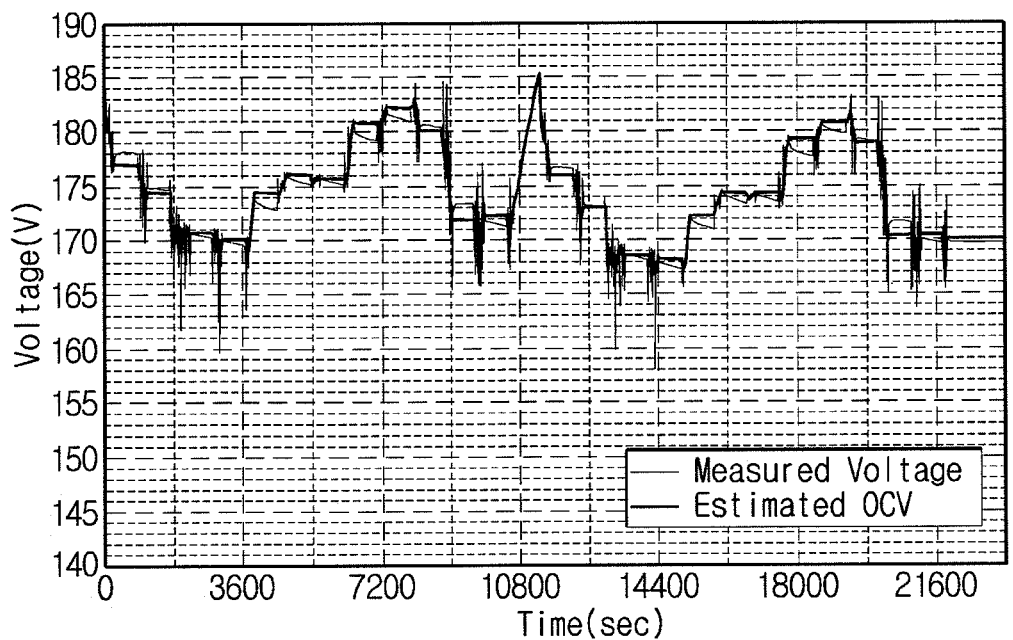
FIG. 6 is a graph illustrating a comparison between an estimated OCV by the present invention and a measured output voltage in the case that a charge/discharge cycle of 250 seconds and a rest period of 10 minutes are applied.
Figure 7:
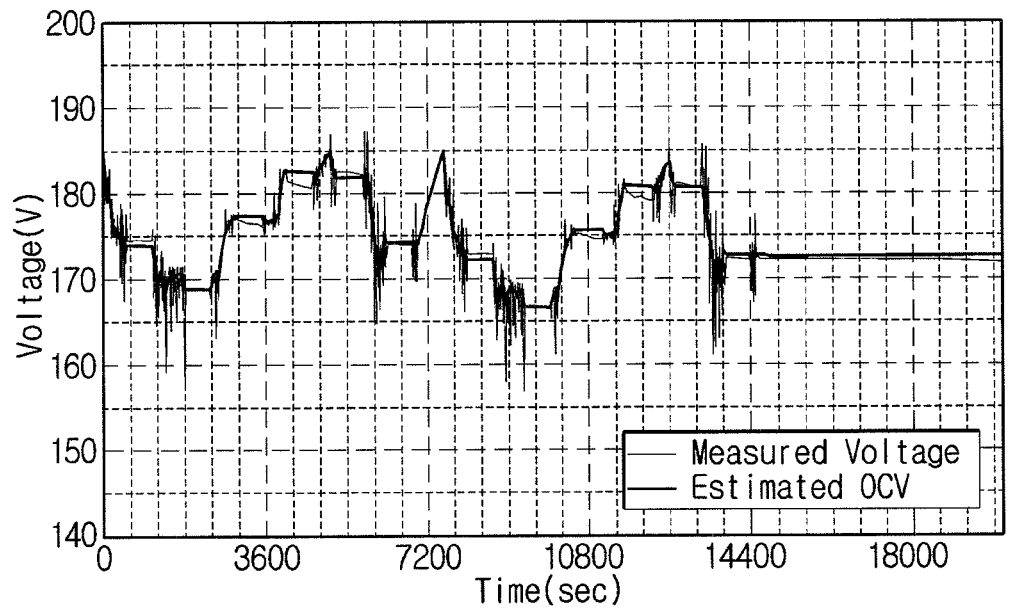
FIG. 7 is a graph illustrating a comparison between an estimated OCV by the present invention and a measured output voltage in the case that a charge/discharge cycle of 500 seconds and a rest period of 10 minutes are applied.

FIGS. 6 and 7 are graphs illustrating a comparison between the estimated OCV by the present invention and an actual output voltage, in the case that the first charge/discharge cycle of 250 seconds with a rest period of minutes is set, and in the case that the second charge/discharge cycle of 50 seconds with a rest period of 10 minutes is set, respectively.

Referring to FIGS. 6 and 7, although a rest period is set between charge/discharge cycles to stabilize an output voltage of a cell, an actual output voltage fluctuates due to IR drop and an OCV estimating according to the present invention can reduce an error caused by IR drop. Accordingly, it is found that the present invention can estimate SOC of a cell more accurately than the prior art.

FIG. 8 is a table illustrating comparison and analysis result for a battery temperature, measured OCV, estimated OCV, difference (error value) between the measured OCV and the estimated OCV, measured SOC, estimated SOC, and difference (error value) between the measured SOC and the estimated SOC, obtained through 38 times experiments under conditions of example 2.

In FIG. 8, Case Nos. 1 to 25 are obtained under conditions of a charge/discharge cycle of 250 seconds and a rest period of 10 minutes, and Case Nos. 26 to 38 are obtained under conditions of a charge/discharge cycle of 50 seconds and a rest period of 10 minutes.

Referring to FIG. 8, 1.4% of RMSE (Root Mean Square Error) and 1.14% of MEA (Mean Absolute Error), obtained by analyzing errors in OCV and SOC, are considerably lower than allowable errors prescribed in the art.

APPLICABILITY TO THE INDUSTRY

The present invention can estimate SOC of a cell more accurately by estimating OCV of the cell after correcting an output voltage error caused by IR drop and change in temperature. In particular, the present invention estimates SOC of a cell using an output voltage of the cell, instead of a conventional current integration method. Thus, the present invention allows a more accurate SOC estimating than the prior art, resulting in substantial elimination of an SOC deviation of a cell, and renders an active cell balancing even during charge/discharge, resulting in elimination of an SOC deviation.

Although the present invention has been described hereinabove, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A cell balancing apparatus using a voltage variation pattern of a battery cell, which balances a state of charge (SOC) of a plurality of cells in a battery, the cell balancing apparatus comprising:
   an open circuit voltage (OCV) estimating means for measuring a voltage of each cell in the battery and estimating an OCV of each cell using a voltage variation pattern of each cell defined by three output voltages $V_n$, $V_{n-1}$ and $V_{n-2}$; and
   a cell balancing means for balancing an SOC of each cell by selecting a target cell for balancing through a comparison of the estimated OCV of each cell and controlling a balancing circuit corresponding to the selected cell,
   the OCV estimating means comprising:
      a voltage measuring unit for measuring the voltage of each cell;
      a temperature measuring unit for measuring a temperature of each cell;
      a data storing unit for periodically receiving the voltage and temperature of each cell from the voltage measuring unit and the temperature measuring unit and storing the voltage and temperature in a memory unit;
      an OCV variation estimating unit for estimating a present OCV variation of each cell by calculating an OCV variation of each cell $\Delta OCV_n(k)$ from the voltage variation pattern including a present voltage and a past voltage, stored in the memory unit, using a mathematical model that defines a correlation between the output voltage variation pattern and the OCV variation, and reflecting a correction factor F(T) corresponding to the temperature of each cell on the calculated OCV variation of each cell; and
      an OCV estimating unit for estimating a present OCV of each cell by reflecting the calculated OCV variation of each cell on a previous OCV of each cell,
   wherein $$\Delta OCV_n(k) = OCV_n(k) - OCV_{n-1}(k) = G(V) \times F(T) = [V_n - V_{n-1}] \times g(V_n, V_{n-1}, V_{n-2}) \times F(T),$$

wherein $g(V_n, V_n-1, V_n-2)$ is a relative ratio of a previous output voltage variation to a present output voltage variation, and
   wherein "n" is an order index of estimating an OCV variation, and "k" is an order index of a cell.

2. The cell balancing apparatus according to claim 1, wherein the OCV estimating unit is configured to correct the estimated OCV by adding a difference between a weighted mean of a plurality of the measured voltages and the previously estimated OCV to the estimated OCV, wherein a higher weighted value is assigned to an earlier measured voltage.

3. The cell balancing apparatus according to claim 1, wherein the cell balancing unit is configured to select, as the target cell for balancing, a cell having the estimated OCV higher than a reference level and operate the balancing circuit corresponding to the selected target cell to discharge the selected target cell.

4. The cell balancing apparatus according to claim 1, wherein the cell balancing unit is configured to select, as the target cell for balancing, a cell having the estimated OCV lower than a reference level and operate the balancing circuit corresponding to the selected target cell to charge the selected target cell.

5. The cell balancing apparatus according to claim 1, wherein the balancing circuit comprises a charge circuit and a discharge circuit, and
wherein the cell balancing unit is configured to select, as the target cell for balancing, a cell having the estimated OCV out of a reference range, operate the balancing circuit corresponding to the selected target cell having the estimated OCV higher than a maximum limit of the reference range to discharge the selected target cell and operate the balancing circuit corresponding to the selected target cell having the estimated OCV lower than a minimum limit of the reference range to charge the selected target cell.

6. A cell balancing apparatus using a voltage variation pattern of a battery cell, which balances a state of charge (SOC) of a plurality of cells in a battery, the cell balancing apparatus comprising:
an OCV estimating means for measuring a voltage of each cell in the battery and estimating an OCV of each cell using a voltage variation pattern of each cell defined by three output voltages $V_n$, $V_{n-1}$ and $V_{n-2}$;
an SOC estimating means for estimating an SOC of each cell from the OCV of each cell; and
a cell balancing means for balancing the SOC of each cell by selecting a target cell for balancing through a comparison of the estimated SOC of each cell and controlling a balancing circuit corresponding to the selected cell,
the OCV estimating means comprising:
a voltage measuring unit for measuring the voltage of each cell;
a temperature measuring unit for measuring a temperature of each cell;
a data storing unit for periodically receiving the voltage and temperature of each cell from the voltage measuring unit and the temperature measuring unit and storing the voltage and temperature in a memory unit;
an OCV variation estimating unit for estimating a present OCV variation of each cell by calculating an OCV variation of each cell $\Delta OCV_n(k)$ from the voltage variation pattern including a present voltage and a past voltage, stored in the memory unit, using a mathematical model that defines a correlation between the output voltage variation pattern and the OCV variation, and reflecting a correction factor $F(T)$ corresponding to the temperature of each cell on the calculated OCV variation of each cell; and
an OCV estimating unit for estimating a present OCV of each cell by reflecting the calculated OCV variation of each cell on a previous OCV of each cell,
wherein $$\Delta OCV_n(k) = OCV_n(k) - OCV_{n-1}(k) = G(V) \times F(T) = [V_n - V_{n-1}] \times g(V_n, V_{n-1}, V_{n-2}) \times F(T),$$

wherein $g(V_n, V_{n-1}, V_{n-2})$ is a relative ratio of a previous output voltage variation to a present output voltage variation, and
wherein "n" is an order index of estimating an OCV variation, and "k" is an order index of a cell.

7. The cell balancing apparatus according to claim 6, wherein the SOC estimating unit is configured to estimate the SOC of each cell by mapping the estimated OCV and the temperature of each cell to a corresponding SOC of each cell using a lookup table including SOC data for each OCV and each temperature.

8. The cell balancing apparatus according to claim 6, wherein the OCV estimating unit is configured to correct the estimated OCV by adding a difference between a weighted mean of a plurality of the measured voltages and the previously estimated OCV to the estimated OCV, wherein a higher weighted value is assigned to an earlier measured voltage.

9. The cell balancing apparatus according to claim 6, wherein the cell balancing unit is configured to select, as the target cell for balancing, a cell having the estimated SOC higher than a reference level and operate the balancing circuit corresponding to the selected target cell to discharge the selected target cell.

10. The cell balancing apparatus according to claim 6, wherein the cell balancing unit is configured to select, as the target cell for balancing, a cell having the estimated SOC lower than a reference level and operate the balancing circuit corresponding to the selected target cell to charge the selected target cell.

11. The cell balancing apparatus according to claim 6, wherein the balancing circuit comprises a charge circuit and a discharge circuit, and
wherein the cell balancing unit is configured to select, as the target cell for balancing, a cell having the estimated SOC out of a reference range, operate the balancing circuit corresponding to the selected target cell having the estimated SOC higher than a maximum limit of the reference range to discharge the selected target cell and operate the balancing circuit corresponding to the selected target cell having the estimated SOC lower than a minimum limit of the reference range to charge the selected target cell.

12. A cell balancing method using a voltage variation pattern of a battery cell, which balances a state of charge (SOC) of a plurality of cells in a battery, the cell balancing method comprising:
measuring a voltage of each cell in the battery and estimating an open circuit voltage (OCV) of each cell using a voltage variation pattern of each cell defined by three output voltages $V_n$, $V_{n-1}$ and $V_{n-2}$; and
balancing the SOC of the plurality of cells through a comparison of the estimated OCV of each cell,
the estimating the OCV comprising:
measuring the voltage and a temperature of each cell;
calculating an OCV variation $\Delta OCV_n(k)$ of each cell from the voltage variation pattern using a mathematical model that defines a correlation between the output voltage variation pattern and the OCV variation;
estimating a present OCV variation of each cell by reflecting a correction factor $F(T)$ corresponding to the temperature of each cell on the calculated OCV variation of each cell; and
estimating a present OCV of each cell by reflecting the calculated OCV variation of each cell on a previous OCV of each cell,
wherein $$\Delta OCV_n(k) = OCV_n(k) - OCV_{n-1}(k) = G(V) \times F(T) = [V_n - V_{n-1}] \times g(V_n, V_{n-1}, V_{n-2}) \times F(T),$$

wherein $g(V_n, V_{n-1}, V_{n-2})$ is a relative ratio of a previous output voltage variation to a present output voltage variation, and
wherein "n" is an order index of estimating an OCV variation, and "k" is an order index of a cell.

13. The cell balancing method according to claim 12, wherein the estimating of the OCV further comprises correcting the estimated OCV by adding a difference between a weighted mean of a plurality of the measured voltages and the previously estimated OCV to the estimated OCV, wherein a higher weighted value is assigned to an earlier measured voltage.

14. The cell balancing method according to claim 12, wherein the operating of the balancing circuit comprises operating the balancing circuit to discharge a cell having the estimated OCV higher than a reference level, to charge a cell having the estimated OCV lower than a reference level, to discharge a cell having the estimated OCV higher than a maximum limit of a reference range or to charge a cell having the estimated OCV lower than a minimum limit of the reference range.

15. A cell balancing method using a voltage variation pattern of a battery cell, which balances a state of charge (SOC) of a plurality of cells in a battery, the cell balancing method comprising:
measuring a voltage of each cell in the battery and estimating an open circuit voltage (OCV) of each cell using a voltage variation pattern defined by three output voltages $V_n$, $V_{n-1}$ and $V_{n-2}$;
estimating an SOC of each cell from the OCV of each cell; and
balancing the SOC of the plurality of cells through a comparison of the estimated SOC of each cell,
the estimating the OCV comprising:
measuring the voltage and a temperature of each cell;
calculating an OCV variation $\Delta OCV_n(k)$ of each cell from the voltage variation pattern using a mathematical model that defines a correlation between the output voltage variation pattern and the OCV variation;
estimating a present OCV variation of each cell by reflecting a correction factor F(T) corresponding to the temperature of each cell on the calculated OCV variation of each cell; and
estimating a present OCV of each cell by reflecting the calculated OCV variation of each cell on a previous OCV of each cell,
wherein $$\Delta OCV_n(k)=OCV_n(k)-OCV_{n-1}(k)=G(V)\times F(T)=[V_n-V_{n-1}]\times g(V_n,V_{n-1},V_{n-2})\times F(T),$$

wherein $g(V_n, V_{n-1}, V_{n-2})$ is a relative ratio of a previous output voltage variation to a present output voltage variation, and
wherein "n" is an order index of estimating an OCV variation, and "k" is an order index of a cell.

16. The cell balancing method according to claim 15, wherein the estimating of the SOC estimates the SOC of each cell by mapping the estimated OCV and the temperature of each cell to a corresponding SOC of each cell using a lookup table including SOC data for each OCV and each temperature.

17. The cell balancing method according to claim 15, wherein the operating of the balancing circuit comprises operating the balancing circuit to discharge a cell having the estimated SOC higher than a reference level, to charge a cell having the estimated SOC lower than a reference level, to discharge a cell having the estimated SOC higher than a maximum limit of a reference range or to charge a cell having the estimated SOC lower than a minimum limit of the reference range.

18. A hardware module comprising:
a processor for executing processes of:
measuring a voltage of each cell in a battery and estimating an open circuit voltage (OCV) of each cell using a voltage variation pattern of each cell defined by three output voltages $V_n$, $V_{n-1}$ and $V_{n-2}$; and
balancing a state of charge (SOC) of a plurality of cells through a comparison of the estimated OCV of each cell,
the estimating the OCV comprising:
measuring the voltage and a temperature of each cell;
calculating an OCV variation $\Delta OCV_n(k)$ of each cell from the voltage variation pattern using a mathematical model that defines a correlation between the output voltage variation pattern and the OCV variation;
estimating a present OCV variation of each cell by reflecting a correction factor F(T) corresponding to the temperature of each cell on the calculated OCV variation of each cell; and
estimating a present OCV of each cell by reflecting the calculated OCV variation of each cell on a previous OCV of each cell,
wherein $$\Delta OCV_n(k)=OCV_n(k)-OCV_{n-1}(k)=G(V)\times F(T)=[V_n-V_{n-1}]\times g(V_n,V_{n-1},V_{n-2})\times F(T),$$

wherein $g(Vn, Vn-1, Vn-2)$ is a relative ratio of a previous output voltage variation to a present output voltage variation, and
wherein "n" is an order index of estimating an OCV variation, and "k" is an order index of a cell.

19. A hardware module comprising:
a processor for executing processes of:
measuring a voltage of each cell in a battery and estimating an open circuit voltage (OCV) of each cell using a voltage variation pattern defined by three output voltages $V_n$, $V_{n-1}$ and $V_{n-2}$;
estimating a state of charge (SOC) of each cell from the OCV of each cell; and
balancing an SOC of a plurality of cells through a comparison of the estimated SOC of each cell,
the estimating the OCV comprising:
measuring the voltage and a temperature of each cell;
calculating an OCV variation $\Delta OCV_n(k)$ of each cell from the voltage variation pattern using a mathematical model that defines a correlation between the output voltage variation pattern and the OCV variation;
estimating a present OCV variation of each cell by reflecting a correction factor F(T) corresponding to the temperature of each cell on the calculated OCV variation of each cell; and
estimating a present OCV of each cell by reflecting the calculated OCV variation of each cell on a previous OCV of each cell,
wherein $$\Delta OCV_n(k)=OCV_n(k)-OCV_{n-1}(k)=G(V)\times F(T)=[V_n-V_{n-1}]\times g(V_n,V_{n-1},V_{n-2})\times F(T),$$

wherein $g(V_n, V_{n-1}, V_{n-2})$ is a relative ratio of a previous output voltage variation to a present output voltage variation, and
wherein "n" is an order index of estimating an OCV variation, and "k" is an order index of a cell.

* * * * *